United States Patent
Tomioka et al.

[11] Patent Number: 5,938,836
[45] Date of Patent: Aug. 17, 1999

[54] APPARATUS AND METHOD FOR MANUFACTURING SEMICONDUCTOR SINGLE CRYSTALS

[75] Inventors: Junsuke Tomioka; Hiroshi Inagaki; Katsura Yamamoto, all of Kanagawa, Japan

[73] Assignee: Komatsu Electronic Metals Co., Ltd., Kanagawa, Japan

[21] Appl. No.: 08/956,434

[22] Filed: Oct. 23, 1997

[30] Foreign Application Priority Data

Oct. 24, 1996 [JP] Japan ................................ 8-299607

[51] Int. Cl.$^6$ .................................................. C30B 15/22
[52] U.S. Cl. ............................ 117/30; 117/32; 117/201; 117/917
[58] Field of Search ................................ 117/30, 32, 200, 117/201, 202, 917

[56] References Cited

U.S. PATENT DOCUMENTS

| | | | |
|---|---|---|---|
| 4,522,790 | 6/1985 | Dantzig et al. | 117/217 |
| 4,592,895 | 6/1986 | Matsutani et al. | 117/202 |
| 4,818,500 | 4/1989 | Boden et al. | 117/202 |
| 4,830,703 | 5/1989 | Matsutani | 423/348 |
| 5,009,865 | 4/1991 | Boden et al. | 117/202 |

*Primary Examiner*—Felisa Hiteshew
*Attorney, Agent, or Firm*—Sughrue, Mion, Zinn, Macpeak & Seas, PLLC

[57] ABSTRACT

This invention provides an apparatus and a method for manufacturing semiconductor single crystals, which enable a steady process of pulling up high-quality single silicon crystals to be easily performed during the growing of silicon single crystals by the CZ method aided by applying a Cusp magnetic field. Three facing homopolar magnets (hereinafter referred to as magnet) 1, 2, and 3 are disposed outside the single-crystal pulling up chamber. The magnet 3 is located at the same height as the free surface of the melt 6 stored in a quartz crucible as the free surface of the melt 6 stored in a quartz crucible 5. Furthermore, the strength of the magnets 3 is set to be weaker than that of the magnets 1 and 2. The flux lines of the magnets 3 substantially pass through the quartz crucible 5 in the horizontal direction. However, the flux lines of the magnet 3 do not reach the silicon single crystal 7 being pulled up. The flux lines perpendicular to the free surface of the melt 6 and the strength of the magnetic field near the growth boundary of the crystal are reduces. Thus, the amount of oxygen coming from the quartz crucible 5 and convection near the free surface of the melt 6, starting from the quartz crucible 5 toward the silicon single crystal, can be minimized.

6 Claims, 2 Drawing Sheets

APPARATUS AND METHOD FOR MANUFACTURING SEMICONDUCTOR SINGLE CRYSTALS

BACKGROUND OF THE INVENTION

1. Field of the Invention

This invention relates to a apparatus and a method for manufacturing semiconductor single crystals by the Czochralski Method (hereinafter referred as the CZ method).

2. Description of the Related Art

The steps of manufacturing silicon single crystals aided by applying of magnetic field are: disposing electric magnets around a single-crystal manufacturing apparatus, applying a magnetic field on the melt to increase its dynamic viscosity, and growing silicon single crystals by the CZ method. Due to the fact that the convection of the melt is restrained by the action of the magnetic field, temperature variations at the location near the free surface of the melt are thus moderated, and a steady growing of silicon single crystals can be obtained. Furthermore, the reaction between the melt and the quartz crucible ($SiO_2$) can be restrained or enhanced by the above steps, thereby providing an effective way to control the oxygen density in silicon single crystals.

FIG. 3 is a schematic drawing showing the operation of pulling up semiconductor single crystals aided by applying a magnetic field. FIG. 3 primarily shows the distribution of flux lines, depictions of components other than a quartz crucible 5 and two facing homopolar magnets 1 and 2 are omitted. Usually, in the case of pulling up silicon single crystals aided by applying a Cusp magnetic field, the free surface of the melt 6 becomes located at the central portion between the up-going magnetic field and the down-going magnetic field. Therefore, as shown by the dotted line in FIG. 3, above the free surface of the melt 6, the flux lines of the facing homopolar magnet 1 deviate in a substantially horizontal direction and penetrate the sidewall of the quartz crucible 5 in a normal direction. Similarly, below the free surface of the melt 6, the flux lines of the facing homopolar magnet 2 deviate into a substantially horizontal direction and penetrate the sidewall of the quartz crucible 5 in a normal direction. This can restrain the convection of the melt along the sidewall of the quartz crucible 5. However, the magnetic field strength at the location adjacent to the growth boundary of the single crystal approaches zero, therefore it is unable to restrict the convection of the melt occurring at the location adjacent to the growth boundary of the single crystal.

Concerning the process of manufacturing single crystals aided by applying a Cusp magnetic field, a method of pulling up single crystals has been disclosed in Japanese Patent Publication Gazette TOKU KOU HEI 2-12920. According to TOKU KOU HEI 2-12920, facing homopolar magnets are respectively disposed on the upper and lower portions of the outer wall of the single-crystal pulling up chamber, and equal-axially symmetric and radially distributed Cusp magnetic fields are formed within the melt during pulling up of single crystals. Furthermore, according to the method of growing single crystals disclosed in Japanese Patent Publication Gazette TOKU KOU HEI 1-282185, during the pulling up of single crystals, the free surface of the melt is located at the central portion between the up-going Cusp magnetic field and the down-going Cusp magnetic field. In addition to the above, several proposals concerning method of growing single crystals aided by applying a Cusp magnetic field have also been offered.

However, in the process of pulling up single crystals disclosed in Japanese Patent Publication TOKU KOU HEI 2-12920, the central portion between the up-going Cusp magnetic field and the down-going Cusp magnetic field is lowered into the interior of the melt during the pulling up operation. This will cause an increase in the viscosity of the melt located beneath the growth boundary of the single crystal, and there is a danger of causing uneven impurity distribution in the silicon single crystal. Furthermore, since the convection of the melt in the upward and downward directions occurring at the location beneath the growth boundary of the single crystal can not be restrained, the density of oxygen entering the single crystal will increase. Likewise, in the process of pulling up single crystals disclosed in Japanese Patent Publication TOKU KOU HEI 1-282185 or in application of the ordinary CZ method by applying a Cusp magnetic field as shown in FIG. 3, the free surface of the melt is located at the central portion between the up-going magnetic field and the down-going magnetic field. In these cases, the magnetic field distribution in the melt near the growth boundary of the crystal is the most dispersed, and the restriction on the convection near the free surface of the melt is small. Therefore, if debris of the quartz crucible or amorphous silicon will float on the free surface of the melt, and these impurities will enter the silicon single crystal being pulled up to cause polycrystallization of the single silicon crystal. Hence, it is difficult to pull up the silicon single crystal at an extremely low oxygen density.

SUMMARY OF THE INVENTION

In view of the above defects, the object of the present invention is to provide an apparatus and a method for manufacturing semiconductor single crystals. According to this invention, in the steps of manufacturing silicon single crystals using the CZ method aided by applying a Cusp magnetic field, it is possible to keep pulling up operation steady and to produce silicon single crystals with extremely low oxygen density.

To achieve the above object, the apparatus for manufacturing semiconductor single crystals according to this invention is characterized in that at least three stages of facing homopolar magnets are disposed outside a single-crystal pulling up chamber.

According to the invention as claimed in claim 1, there is provided an apparatus for pulling up semiconductor single crystals from a crucible filled with a melt of raw material by the Czochralski Method, comprising: a pulling up chamber in which the crucible is mounted; at least two annular magnets disposed outside the chamber; and at least one additional annular magnet between the magnets, wherein the annular magnets and the additional annular magnet are disposed so that all of adjacent two magnets thereof are homopolar each other.

According to the invention as claimed in claim 2, there is provided the apparatus for pulling up semiconductor single crystals as claimed in claim 1, wherein the additional annular magnet is disposed at the level of the melt surface.

According to the invention as claimed in claim 3, there is provided the apparatus for pulling up semiconductor single crystals as claimed in claim 1, wherein the additional annular magnet is disposed at the level of the melt surface so that a density of magnetic flux line at a vicinity of the melt surface is higher than that of other portion.

According to the invention as claimed in claim 4, there is provided the apparatus for pulling up semiconductor single crystals as claimed in claim 1, wherein the additional annular magnet is disposed so that an magnetic intensity at a vicinity of the melt surface is smaller than that of other portion.

According to the invention as claimed in claim 5, there is provided the apparatus for pulling up semiconductor single crystals as claimed in claim 3, wherein plurality of additional annular magnets are disposed between the magnets.

According to the invention as claimed in claim 6, there is provided a method for manufacturing semiconductor single crystal, comprising a step of:

pulling up the single crystal from a melt in a crucible in a pulling chamber while restraining convection near the free surface of the melt by applying a magnetic field to the melt so that flux lines are kept perpendicular to the free surface of the melt and the strength of the magnetic field near the growth boundary of the single crystal in the melt is reduced.

Furthermore, the method for manufacturing semiconductor single crystals according to this invention is characterized in that: in the process of utilizing the above apparatus for manufacturing semiconductor single crystals, the flux lines are kept to be perpendicular to the free surface of the melt and the strength of magnetic field near the growth boundary of the crystal is reduced. Therefore, convection near the free surface of the melt can be restrained during single-crystal pulling up operation.

In the case that two stages of facing homopolar magnets are respectively disposed on the upper and lower portions of the outer wall of a conventional semiconductor single-crystal manufacturing apparatus, flux lines near the free surface of the melt are dispersed and the effect of restraining the convection of the melt in the horizontal direction is insignificant. However, according to the above structure, due to the fact that at least three stages of facing homopolar magnets are disposed outside the outer wall of single-crystal pulling up chamber, the density of flux lines near the free surface of the melt can be elevated by one or two magnets disposed near the free surface of the melt.

Therefore, in the case of using the above semiconductor single-crystal manufacturing apparatus, near the free surface of the melt, the amount of flux lines perpendicularly passing through the wall of the quartz crucible will increase and perpendicularity of flux lines passing through the free surface of the melt will be improved. Consequently, the amount of oxygen coming from the quartz crucible and entering the melt can be restrained, and horizontal convection near the free surface of the melt, starting from the quartz crucible toward the silicon single crystal being lifted, also can be restrained. Thus, the oxygen density in the single crystal produced can be reduced. In addition, even if impurities are floating on the free surface of the melt, they will not enter the silicon single crystal being pulled up. Furthermore, the viscosity of the melt beneath the growth boundary of the crystal can be prevented from increase by reducing the strength of the magnetic field near the growth boundary of the crystal, thereby making uniform the distribution of impurities in single crystals produced.

BRIEF DESCRIPTION OF THE DRAWINGS

The present invention can be more fully understood by reading the subsequent detailed description and examples with reference made to the accompanying drawings, wherein.

DETAILED DESCRIPTION OF THE PREFERRED EMBODIMENT

Figure 1:
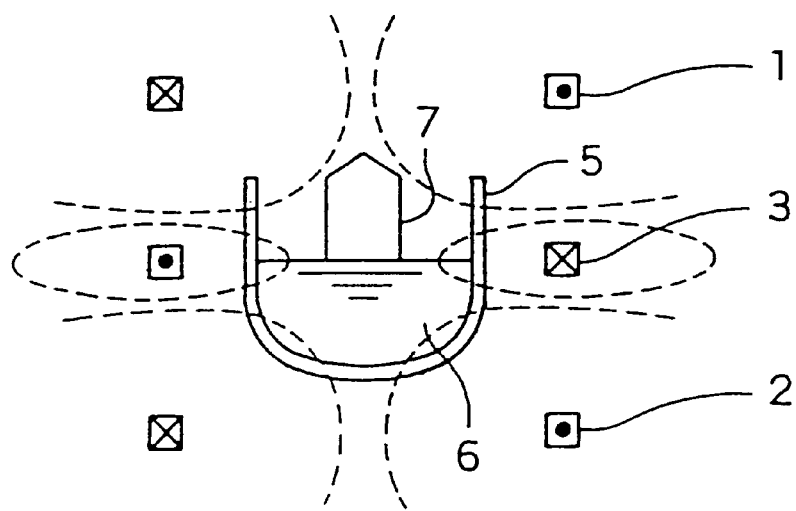
FIG. 1 is a schematic drawing showing the operation of pulling up semiconductor single crystals according to the first embodiment of this invention.

The description of embodiments of the apparatus and the method for manufacturing semiconductor single crystals according to this invention will be made hereinafter with reference to the accompanying drawings. Equipment except for the quartz crucible and magnets is omitted in the drawings that are chiefly used to depict the status of flux lines.

FIG. 1 is a schematic drawing showing the operation of pulling up semiconductor single crystals according to the first embodiment of this invention. As shown in FIG. 1, three facing homopolar magnets (hereinafter referred as "magnet") 1, 2, and 3 are disposed outside the single-crystal pulling up chamber. The magnet 3 is disposed between the magnets 1 and 2, and it is located at the same height as the free surface of the melt 6 stored in a quartz crucible 5. Furthermore, the strength of the magnets 3 is set to be weaker than that of the magnets 1 and 2, and its flux lines substantially pass through the quartz crucible 5. However, the flux lines of the magnet 3 do not reach the silicon single crystal 7 being pulled up.

Figure 3:
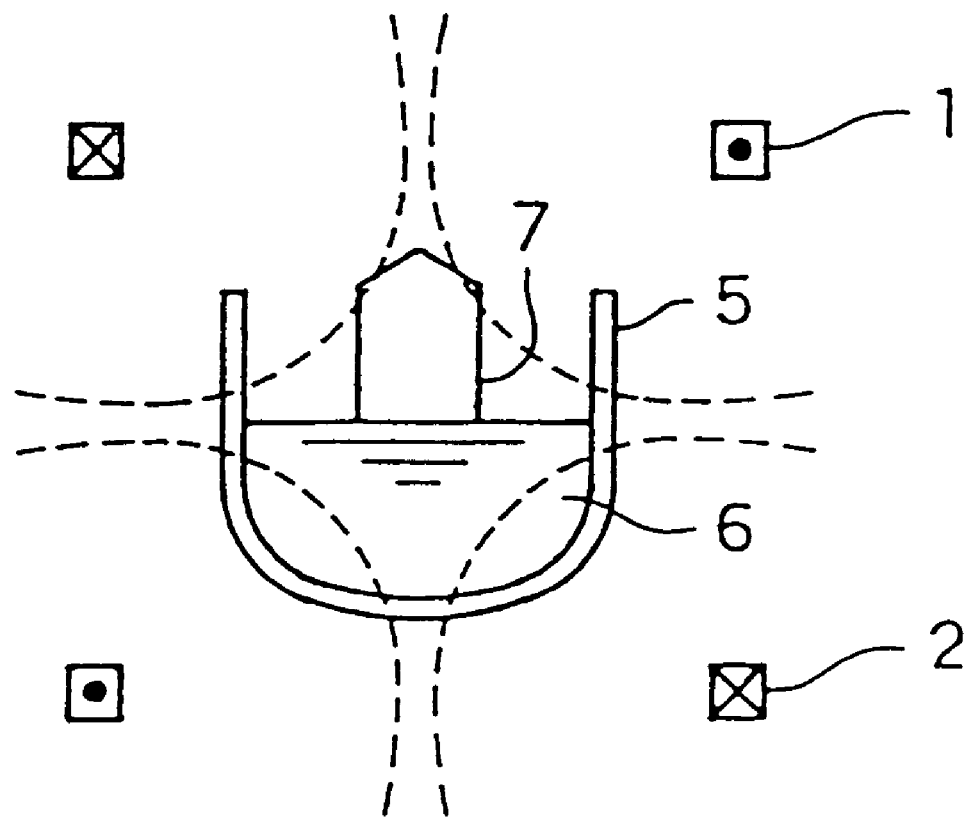
FIG. 3 is a schematic drawing showing a conventional operation of pulling up semiconductor single crystals aided by applying a magnetic field.

As shown in FIG. 3, in a conventional Cusp magnetic field, the flux lines are substantially perpendicular to the greater part of the wall of the quartz crucible, and convection along the wall of the quartz crucible can be restrained. Compared with the above case, on the occasion that three magnets 1, 2, and 3 are disposed, the flux lines are perpendicular to the greater part of the wall of the quartz crucible and the flux lines of the magnet 3 are in like fashion perpendicular to the free surface of the melt 6 near the quartz crucible 5. Thus, the amount of oxygen coming from the quartz crucible 5 and entering the melt 6 can be restrained, and horizontal convection near the free surface of the melt 6, starting from the quartz crucible 5 toward the silicon single crystal 7 being pulled up, also can be restrained. Consequently, the oxygen density in silicon single crystals produced can be reduced. In addition, even if insoluble ingredients such as $SiO_x$ or $SiO_2$ are floating on the free surface of the melt, they will not enter the silicon single crystal being pulled up. Therefore, polycrystallization of the single silicon crystal will not occur.

Figure 2:
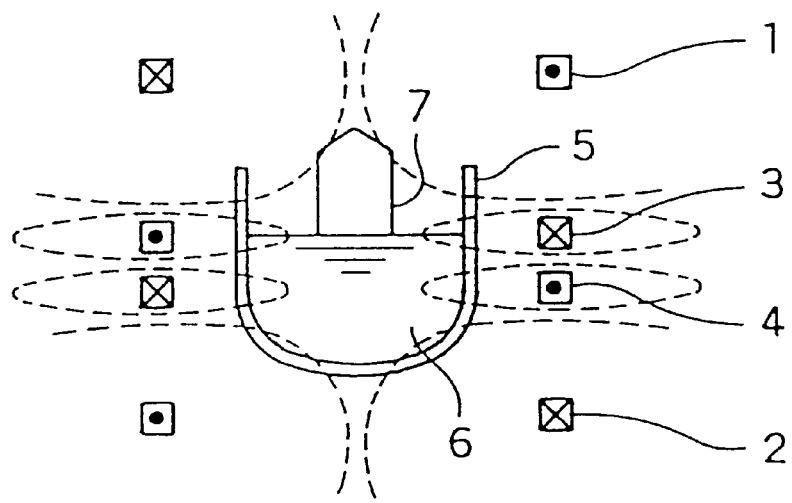
FIG. 2 is a schematic drawing showing the operation of pulling up semiconductor single crystals according to the second embodiment of this invention.

FIG. 2 is a schematic drawing showing the operation of pulling up semiconductor single crystals according to the second embodiment of this invention. As shown in FIG. 2, four magnets 1, 2, 3, and 4 are disposed outside the single-crystal pulling up chamber. The magnets 3 and 4 are disposed between the magnets 1 and 2, and the magnet 3 are located at the same height as the free surface of the melt 6 stored in a quartz crucible 5. Furthermore, the strength of the magnets 3 and 4 is set to be weaker than that of the magnets 1 and 2, and the flux lines of the magnets 3 and 4 pass through the quartz crucible 5. However, the flux lines of the magnet 3 do not reach the silicon single crystal 7 being pulled up.

Compared with the first embodiment, in the second embodiment, four facing homopolar magnets 1, 2, 3, and 4 are disposed to increase the amount of flux perpendicular to the wall of the quartz crucible, therefore the effect of restraining convection of the melt along the wall of the quartz crucible is enhanced. Furthermore, the perpendicularity of the flux lines passing through the free surface of the melt is enhanced; therefore the effect of restraining convection of the melt near the free surface of the melt in the horizontal direction is improved. Consequently, even if insoluble ingredients such as $SiO_x$ or $SiO_2$ are floating on the free surface of the melt, they will not enter the silicon single crystal being pulled up.

In a conventional apparatus for manufacturing semiconductor single crystals aided by applying a Cusp magnetic field (see FIG. 3), applying a magnetic field perpendicular to the free surface of the melt can be performed by moving the magnets 1 and 2 upward or downward. However, part of the flux lines will reach the portion beneath the growth boundary of the single crystal, and the viscosity of the melt beneath the growth boundary of the single crystal will increase. Consequently, it is difficult to keep impurity distribution within crystal boundaries uniform. According to this invention, the magnetic field near the growth boundary of the single crystal is-kept small, therefore the above problem will not occur.

It is possible to use superconductive magnets as facing homopolar magnets. By this, magnets can be miniaturized, and the space required by a semiconductor single-crystal manufacturing apparatus can be reduced.

As described above, according to this invention, at least three stages of facing homopolar magnets are provided to apply a Cusp magnetic field. In addition, the flux lines are kept perpendicular to the free surface of the melt and the strength of the magnetic field near the growth boundary of the single crystal is reduced. Therefore, the amount of oxygen coming from the quartz crucible decreases and silicon single crystals with low oxygen density can be obtained. Moreover, even if impurities are floating on the free surface of the melt, they are prevented from entering the silicon single crystal being pulled up. Therefore, polycrystallization of single silicon crystal can be avoided and it is possible to manufacture a high-quality single silicon.

What is claimed is:

1. An apparatus for pulling up semiconductor single crystals from a crucible filled with a melt of raw material by the Czochralski Method, comprising:

a pulling up chamber in which the crucible is mounted; at least two annular magnets disposed outside the chamber;

and at least one additional annular magnet between the magnets wherein the annular magnets and the additional annular magnet are disposed so that all of adjacent two magnets thereof are homopolar to each other.

2. The apparatus for pulling up semiconductor single crystals as claimed in claim 1, wherein the additional annular magnet is disposed at the level of the melt surface.

3. The apparatus for pulling up semiconductor single crystals as claimed in claim 1, wherein the additional annular magnet is disposed at the level of the melt surface so that a density of magnetic flux lines at a vicinity of the melt surface is higher than that of other portion.

4. The apparatus for pulling up semiconductor single crystals as claimed in claim 3,wherein plurality of additional annular magnets are disposed between the magnets.

5. The apparatus for pulling up semiconductor single crystals as claimed in claim 1, wherein the additional annular magnet is disposed so that an magnetic intensity at a vicinity of the melt surface is smaller than that of other portion.

6. A method of manufacturing semiconductor single crystal in an apparatus for pulling up semiconductor single crystals from a crucible filled with a melt of raw material by the Czochralski Method, comprising a pulling up chamber in which the crucible is mounted, at least two annular magnets disposed outside the chamber, and at least one additional annular magnet between the magnets wherein the annular magnets and the additional annular magnet are disposed so that all of adjacent two magnets thereof are homopolar to each other, the method comprising a step of:

pulling up the single crystal from a melt in a crucible in a pulling chamber while restraining convection near the free surface of the melt by applying a magnetic field to the melt so that flux lines are kept perpendicular to the free surface of the melt and the strength of the magnetic field near the growth boundary of the single crystal in the melt is reduced.

* * * * *